United States Patent [19]

Jeng

[11] Patent Number: 5,371,470
[45] Date of Patent: Dec. 6, 1994

[54] TRANSVERSE FILTER CIRCUIT

[75] Inventor: Peide Jeng, Tucson, Ariz.

[73] Assignee: Photometrics, Ltd., Tucson, Ariz.

[21] Appl. No.: 27,293

[22] Filed: Mar. 4, 1993

[51] Int. Cl.$^5$ .......................................... H03H 15/00
[52] U.S. Cl. ................................... 327/552; 333/166; 327/361
[58] Field of Search .................. 325/42; 324/77 E; 387/520, 521, 494; 328/165, 167, 166, 159; 330/107, 109, 306; 333/166

[56] References Cited

U.S. PATENT DOCUMENTS

| | | | |
|---|---|---|---|
| 3,573,623 | 4/1971 | Bannon | 325/42 |
| 3,614,673 | 10/1971 | Kang | 324/77 E |
| 3,987,293 | 10/1976 | Crooke et al. | 328/167 |
| 4,039,978 | 8/1977 | Heller | 328/167 |
| 4,120,035 | 10/1978 | Cases et al. | 328/167 |
| 4,417,317 | 11/1983 | White et al. | 333/165 |
| 4,724,395 | 2/1988 | Freeman | 307/520 |

Primary Examiner—Timothy P. Callahan
Assistant Examiner—Dinh Le
Attorney, Agent, or Firm—Herbert M. Shapiro

[57] ABSTRACT

A transverse filler for use in a CCD camera eliminates KTC noise even at very fast pixel rates with relatively relaxed constraints on component accuracy and timing control, The circuit includes summation, divider and subtraction circuits which add the plural outputs of a tapped delay line to which a video signal is applied and generate average KTC noise and KTC noise plus signal representations. The output of the circuits is applied to the input of an capacitor and the output of the capacitor is connected to an electronic switch and to a Sample-and-Hold amplifier. The capacitor is operative to subtract the average KTC noise from the average KTC plus Video signal, The circuit is able to run on-board binning and does not have pixel feedthrough problems.

7 Claims, 2 Drawing Sheets

TRANSVERSE FILTER CIRCUIT

This invention relates to a transverse filter circuit and more particularly to such a circuit for use in a charge-coupled device (CCD) camera.

BACKGROUND OF THE INVENTION

A major problem in CCD camera systems is the elimination of KTC noise, the thermal noise of the FET switch associated with a CCD reset gate and is a function of temperature (T) and capacitance (C) of the gate times a constant (K). Prior art CCD camera systems employ three types of circuits to eliminate KTC noise. The first of these is the DC Restore Circuit DCR, which samples the KTC noise at two different positions in a pixel signal and subtracts the second valise from the first value obtained, This circuit has to work with a Low Pass Filter (LPF) to limit the noise bandwith. Such a filter causes pixel feedthrough problems and requires the circuit designer to compromise between system noise and pixel feedthrough. The advantage of the CDS circuit is that it can operate at high speed and change the pixel rate on the fly.

The second type of circuit is the Dual Slope Integrator(DSI) which has the highest performance of the three types of circuits but requires the most accurate components to implement. It is impractical to implement at high pixel rates because it requires two integration operations.

The third type of circuit is the Transverse Filter (TF) which can operate at very high pixel rates and does not have the feedthrough problems. Such a filter requires an accurate high speed Differential Amplifier and precision passive delay lines for achieving acceptable performance. Further, such a filter requires very precisely controlled timing causing increased difficultly in implementation. Also, once the hardware is installed (i.e. the delays are set), the read out speed is set and impossible to change during operation. This later draw hack prevents the system from carrying a out binning operations which are important for CCD systems which do not have binning registers.

It is clear that each of the three types of prior art circuits for eliminating KTC noise has its drawbacks. A characteristic of a system employing any one of the above types of circuits is that it uses the DSI for low pixel rate and DCR or TF for high pixel rates but not both. The three types of circuits and the operations of the circuits are well known in the art and not described specifically.

BRIEF DESCRIPTION OF AN ILLUSTRATIVE EMBODIMENT OF THIS INVENTION

In accordance with the principle of this invention, a transverse filter includes not only the usual tapped delay line and an operational amplifier, but also a summation circuit for averaging the outputs of the tapped delay line and a subtraction circuit for subtracting the resulting average KTC noise signal from the resulting average KTC noise plus signal. This invention combines high speed pixel rates, the ability to change pixel rates on the fly, with the elimination of pixel feedthrough problem. Also with the tapped delay line and the summation circuit for averaging the signals, the constraints on component and timing control can be relaxed.

DETAILED DESCRIPTION OF AN ILLUSTRATIVE EMBODIMENT OF THIS INVENTION

Figure 1:
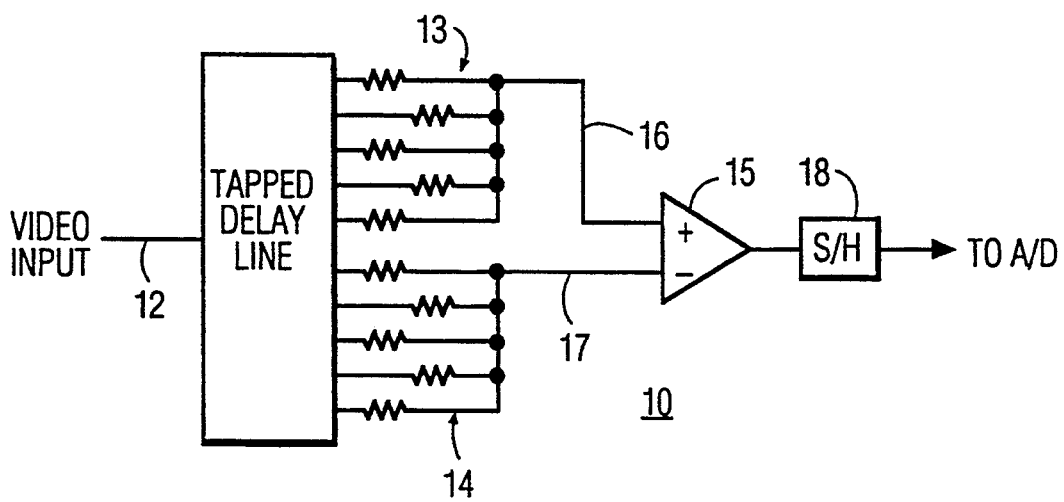
FIG. 1 is a circuit diagram of a prior art transverse filter.

FIG. 1 shows a prior art transverse filter 10. The filter includes a tapped delay line 11 having an input 12 to which video signals are applied as a coded sequence of pixels from a charge coupled device.

The tapped delay line includes two sets of output 13 and 14, a representative five of which are shown in each instance. Each output delays each pixel representation a different amount. The outputs 13 and 14 are applied directly to the positive and negative inputs of an operation amplifier 15 on line 16 and line 17. The output of the amplifier is connected to a Sample-and-Hold (S&H) amplifier 18 and then to an analog to digital converter not shown in FIG. 1.

Figure 2:
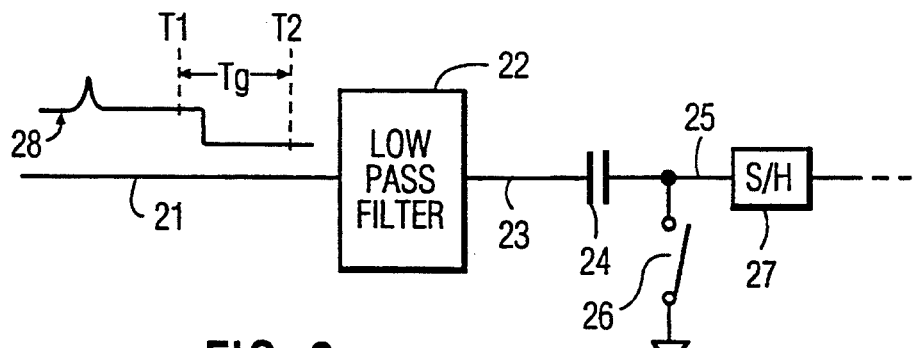
FIG. 2 is a circuit diagram of a prior art DC Restore circuit.

FIG. 2 shows a prior art DC Restore circuit 20. This circuit includes a Low Pass Filter (LPF) 22 having an input 21 to which video signals are applied. The output 23 of the Low Pass Filter is connected to a capacitor 24. The output 25 of the capacitor 24 goes to a electronic switch 26 and a sample-and-hold amplifier 27. The electronic switch can be either an analog switch or a transistor. The DC Restore (DCR) circuit operates as follows:

First., the electronic switch 26 is programmed to turn on prior to T1. The capacitor 24 is charged to the level at T1. Next switch 26 is turned off at time T1. The CCD then is coded to shift charges to the CCD output gate which is not shown in the figure. When the charges arrive at the output gate, the voltage level of the output gate changes by a level shown as a video signal in 28. After the half pixel readout time Tg, the sample and hold circuit is timed on to do the second sampling. At time T2 plus the time dependent on the S&H amplifier chosen, the sample and hold circuit is turned off. When switch 26 is off, the capacitor 24 works like a subtractor which subtracts the signal added on to it, from the signal it stored previously. So, through the timing control shown on the video pixel signal 28, the video signal shown at T1 will be subtracted from the video signal shown at T2 through capacitor 24.

Figure 3:
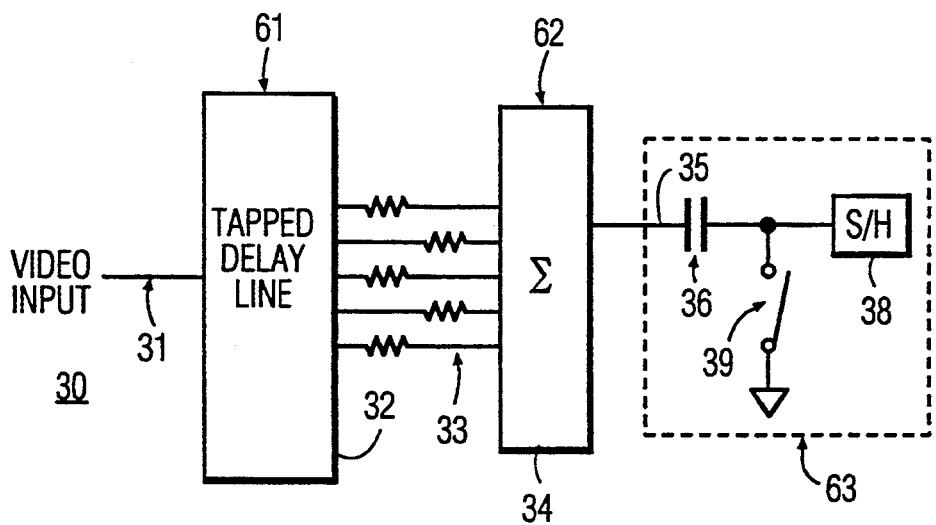
FIG. 3 is a circuit diagram of a transverse filter in accordance with the principles of this invention.

FIG. 3 shows a transverse filter 30 in accordance with the principles of this invention. The, filter includes a tapped delay line 32 which also has an input 31 to switch video signals are supplied. The delay line also includes a plurality of output lines 33 each with a different relay. In this instance, the outputs 33 are applied to the input of a summation circuit 34. Summation circuits will be described below in detail. The summation circuit is operative to average the delayed video signals to eliminate the need for a noise bandwidth limit Low Pass Filter.

The output of the summation circuit is connected to a DC Restore circuit shown as in FIG. 2 (23 to 27). The timing control for sample and hold circuit 38 and switch 39 are similar to the DC Restore timing control which are described above.

Figure 4:
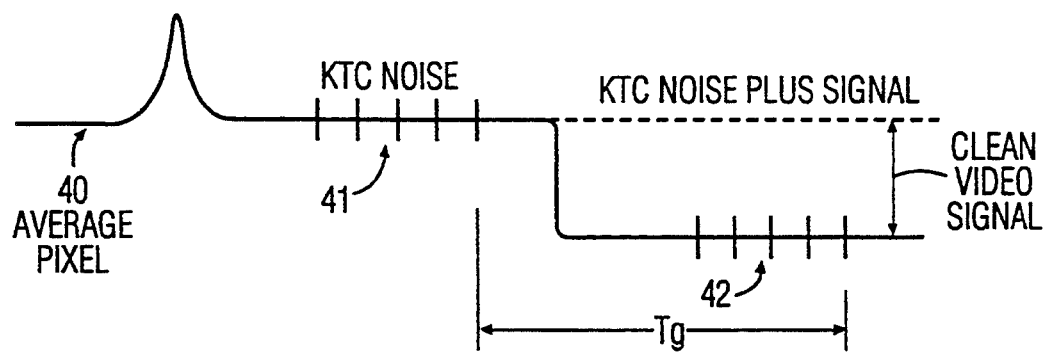
FIG. 4 is a waveform of an averaged pixel signal showing KTC noise and KTC plus signal sampling by tile circuit of FIG. 3.

FIG. 4 shows a waveform of a pixel 40 in a stream of pixels of a video signal which is sampled by a transverse filter in accordance with the principles of this invention. The waveform is sampled, illustratively at least five times, as illustrated by the vertical marks 41 and 42 along the base line. The sampling occurs at five points in the waveform as shown: to the left are samples of the KTC noise; to the right are samples of the KTC noise plus signal. The delay between these two sample groups is represented as Tg in the figure. The control of time Tg permits the pixel width to be increased or decreased thus allowing the pixel rate change and binning operation, which is not possible in prior art transverse filters. The video average through the summation circuit relaxes 1.) the constraints of precise timing, 2) the need for precision components required in prior transverse filters and 3.) also eliminates the need for a LPF in prior art DCR. Through the substraction technique similar to the DC Restore circuit, a clean video signal is obtained.

Figure 5:
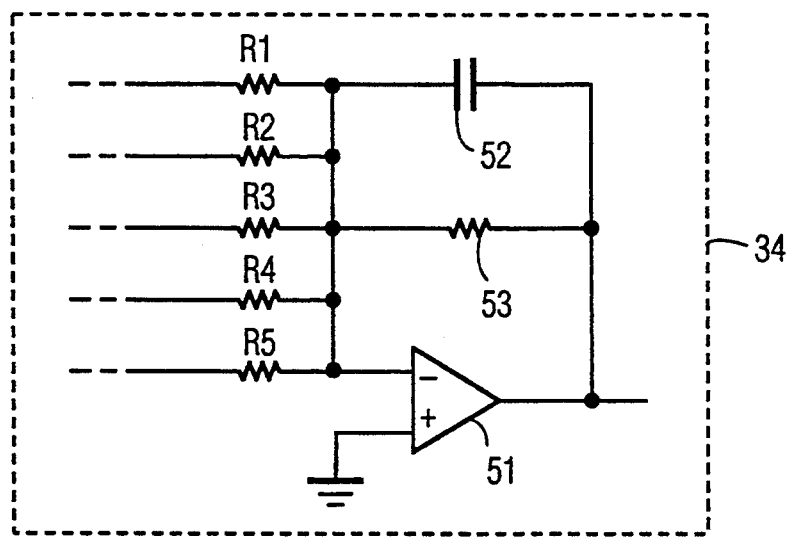
FIG. 5 is a circuit diagram of a portion of the circuit in FIG. 3.

FIG. 5 shows the circuit diagram of summation circuit 34 of FIG. 3. The circuit includes a plurality of resistors, shown as R1-R5; each resistor has two functions. The first function is as a load resistor for the tapped delay line. Its resistance is chosen to be large enough compared to the output impedance of the delay line to prevent an error called load effect. The second function is as the input resistor for an inverting amplifier. R1 through R5 and the feedback resistor R6 determine the circuit gains. These circuit gains also provide the division required in averaging signals. The expression of the relation between the output and the inputs are well known in the art and are not described here.

Circuit 51 of FIG. 5 is a low noise high speed operational amplifier. The capacitor 52 and resistor 53 define an anti-aliasing filter for preventing high frequency signals from influencing low frequency signals through the tapped delay line sampling. The positive input of amplifier 51 is connected to ground as shown.

Figure 6:
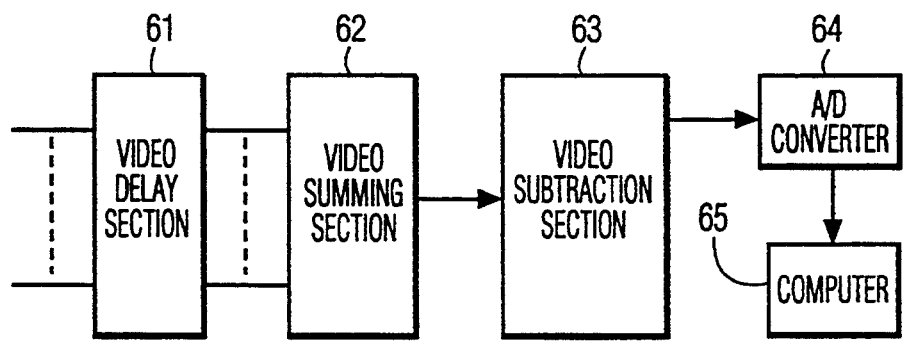
FIG. 6 is a block diagram of the circuit of FIG. 3.

FIG. 6 shows a block diagram of the circuit of FIG. 3. The circuit can be thought of as divided into three sections; a video delay section 61, a video summation section 62 and a video subtraction section 63. The sections are shown also in FIG. 3. The output of the video subtraction section is applied to analog to digital (A/D) converter 64, the output of which is communicated to a computer 65.

What is claimed is:

1. A transverse filter for eliminating KTC noise from a video signal comprising a sequence of pixel representations each of said representations having a waveform with first and second portions where KTC noise and KTC noise plus signal can be measured, said filter including first means for sampling each of said pixel representations a plurality of times each with a different delay for generating a plurality of associated pairs of KTC noise and KTC noise plus signal representations, said filter also including second means for summing the KTC noise representations and the KTC noise plus signal representations separately for producing a KTC noise representation and a KTC noise plus signal representation, said filter also including third means for dividing each of said representations by the number of tapped delay lines to form average values of said KTC noise and said KTC noise plus signal representations said filter also including fourth means for subtracting said average KTC noise representation from said average KTC noise plus signal representation.

2. A transverse filter as in claim 1 wherein said first means comprises a tapped delay line.

3. A transverse filter as in claim 2 wherein said second means comprises a summation circuit.

4. A transverse filter as in claim 3 wherein said third means includes a divider circuit.

5. A transverse filter as in claim 4 wherein said fourth means comprises a subtraction circuit.

6. A transverse filter bar eliminating KTC noise from a video signal supplied by a charge couple device, said filter comprising means sampling each pixel representation in a stream of video signals a plurality of times each with a different delay for providing a plurality of KTC noise and KTC plus signal representations, said filter including a summation circuit for summing said plurality of KTC noise and KTC plus signal representation, said filter also including means for dividing said representations by the number of different delays, and means for subtracting the resulting average KTC noise representation from the average KTC plus signal representation.

7. A transverse filter, said filter comprising a tapped delay line having a plurality of outputs and an input for receiving video signals comprising a sequence of pixel representations, said circuit also including a summation circuit having an input and an output, said plurality of outputs from said delay line being connected to said input of said summation circuit, said filter also amplifier means and means for generating averaged KTC noise and KTC noise plus signal representations for each pixel in a stream of video signals, said KTC noise plus signal representations being delayed from said KTC noise representation a period equal to one half a pixel width.

* * * * *